(12) United States Patent
Arnett

(10) Patent No.: US 6,736,681 B2
(45) Date of Patent: May 18, 2004

(54) COMMUNICATIONS CONNECTOR THAT OPERATES IN MULTIPLE MODES FOR HANDLING MULTIPLE SIGNAL TYPES

(75) Inventor: Jaime Ray Arnett, Fishers, IN (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 10/269,211

(22) Filed: Oct. 3, 2002

(65) Prior Publication Data

US 2004/0067693 A1 Apr. 8, 2004

(51) Int. Cl.[7] .............................................. H01R 24/00
(52) U.S. Cl. ...................................... 439/676; 439/955
(58) Field of Search ................................ 439/676, 955

(56) References Cited

U.S. PATENT DOCUMENTS

| | | | |
|---|---|---|---|
| 5,096,439 A | | 3/1992 | Arnett ......................... 439/536 |
| 5,096,442 A | | 3/1992 | Arnett et al. ................ 439/676 |
| 5,186,647 A | | 2/1993 | Denkmann et al. .......... 439/395 |
| 5,244,402 A | * | 9/1993 | Pasterchick, Jr. et al. ... 439/217 |
| 5,867,576 A | * | 2/1999 | Norden ........................ 379/438 |
| 5,997,358 A | * | 12/1999 | Adriaenssens et al. ....... 439/676 |
| 6,056,568 A | * | 5/2000 | Arnett ......................... 439/188 |
| 6,074,256 A | * | 6/2000 | Arnett ......................... 439/676 |
| 6,079,996 A | * | 6/2000 | Arnett ......................... 439/188 |
| 6,244,907 B1 | | 6/2001 | Arnett ......................... 439/676 |
| 6,558,203 B2 | * | 5/2003 | Pocrass ........................ 439/676 |

* cited by examiner

Primary Examiner—Tulsidas Patel
Assistant Examiner—Hae Moon Hyeon
(74) Attorney, Agent, or Firm—Thomas, Kayden, Horstemeyer & Risley, LLP

(57) ABSTRACT

A communications connector assembly comprising a jack configured to mate with at least two different types of plugs. The jack comprises a wire board having first and second signal processing circuits thereon. When a first one of the different types of plugs is mated with the jack, the first signal processing circuit is activated. When a second one of the different types of plugs is mated with the jack, the second signal processing circuit is activated. The first signal processing circuit of the connector assembly includes crosstalk compensation circuitry. The first and second signal processing circuits constitute separate signal paths on the wire board. Thus, when the first plug is inserted into the jack, the signal is operated on in accordance with the configuration of the first signal processing circuitry and when the second plug is inserted into the jack, the signal is operated on in accordance with the configuration of the second signal processing circuitry.

16 Claims, 5 Drawing Sheets

COMMUNICATIONS CONNECTOR THAT OPERATES IN MULTIPLE MODES FOR HANDLING MULTIPLE SIGNAL TYPES

TECHNICAL FIELD OF THE INVENTION

The present invention generally relates to communications connector assemblies. More particularly, the present invention relates to a multi-position communications connector that is configured to operate in multiple modes for handling multiple signals.

BACKGROUND OF THE INVENTION

Telecommunication equipment has benefited from the design of electrical plugs and jacks that provide easy connect/disconnect capability between electrical circuits within the telecommunications equipment and, for example, local network wiring. Such plugs and jacks are particularly popular in association with telephone sets, where they were first used, and, more recently, in association with a large variety of peripheral equipment that is connected to telephone lines. The modular plugs and jacks in use today have been standardized insofar as their performance specifications are concerned and also insofar as certain critical dimensions and structural features are concerned. The use of these devices has become so widespread that new houses and other buildings are pre-wired with jacks located throughout the various rooms, as well as in other strategic locations, to accommodate the communication equipment.

Where large numbers of such connections are needed, it is typical practice to route the wires to a central location, such as a communication closet, where, typically, the jacks are mounted on patch panels. An example of such an arrangement is disclosed in U.S. Pat. No. 5,096,439 of J. R. Arnett. In most installations, it is desirable that the jack be compact, and there have been numerous jacks designed to achieve this goal. For example, U.S. Pat. No. 5,096,442 of J. R. Arnett discloses one such compact jack and plug arrangement, which together constitute a compact electrical connector. The compact electrical connector shown in that patent includes a metallic lead frame mounted to a spring block. The lead frame comprises a number of flat elongated conductors, each terminating in a spring contact at one end and an insulation displacement connector at the other end. The insulation displacement connectors are folded around opposite side walls of the spring block and achieve compactness, and the spring contacts are folded around the front surface of the spring block for insertion into a jack frame. The front surface of the spring block includes a tongue-like projection which fits into one end of the jack frame and interlocks therewith.

The ability of connector assemblies to operate well at high frequencies is limited by crosstalk within the assembly components, especially in the plug, and as frequencies increase, so does the limiting effect of crosstalk. In particular, the rate of data flow, which is ever increasing in communications, causes the wiring parts to become, in effect, antennae that both broadcast and receive electromagnetic radiation. This causes different pairs of wires to be electromagnetically coupled together (i.e., crosstalk), which degrades the signal-to-noise ratio and increases error rates.

Numerous arrangements have been proposed for reducing the effects of crosstalk, including connector assemblies that are configured to minimize crosstalk and connector assemblies that comprise crosstalk compensating components in the overall circuit, such as additional capacitance in the jack for nullifying or compensating for crosstalk in the plug. For example, U.S. Pat. No. 5,186,647 of W. J. Denkmann et al. discloses an electrical connector for conducting high frequency signals in which the input and output terminals are interconnected by a pair of metallic lead frames mounted on a dielectric spring block. The lead frames, which are substantially identical to each other, each comprise several flat elongated conductors, which terminate in spring contacts at one end and insulation displacement connectors at the other end. The conductors generally are parallel and close to each other, but at least one conductor of one frame is arranged to overlap at least one conductor of the other frame in a crossover region. As a result, the crosstalk between the conductors is reduced due to the reversal in polarities caused by the crossovers.

Notwithstanding these advances in dealing with crosstalk in connector assemblies, an electrical connector having even less crosstalk would be desirable. It is also desirable to have a connector that is configured to make circuit connections for uses other than crosstalk manipulation in order to provide a greater degree of versatility. The connector assembly disclosed in the aforementioned U.S. Pat. No. 6,244,907, which is assigned to the assignee of the present application and which is incorporated herein by reference in its entirety, comprises a jack that that is configured to mate with two different types of plugs. A first one of the two types of plugs can be inserted farther into the jack than the second one of the two types of plugs. When the first plug is mated with the jack, the contact wires on the plug abut free ends of the contact wires of the jack and cause the contact wires of the jack to deflect toward and come in contact with conductive pads on the wire board. The conductive pads electrically connect the plug contact wires with compensation circuitry on the wire board, which has the effect of reducing crosstalk.

The second plug cannot be inserted as far into the jack as the first plug. The contact wires of the second jack do not come into contact with the free ends of the jack contact wires, and so the free ends are not deflected onto the conductive pads. Hence, the compensation circuitry is not activated. Therefore, either the compensation circuitry is on or off, depending on which type of plug is inserted into the jack, because either contact is made with the conductive pads or not.

Regardless of whether the compensation circuitry is activated or not, the signal path of the wire board is always the same, i.e., the signal path is never through the conductive pads and the compensation circuitry, but is always from the contact wires of the plug through the non-free ends of the contact wires of the jack (i.e., the ends that are attached to the board). Consequently, regardless of the type of plug that is inserted into the jack, the signal path is always the same through the wire board circuitry.

A need exists for a communications assembly comprising a jack that is not only capable of coupling with different types of plugs, but that is also capable of handling different signal types and of processing the signals in a manner dictated by the type of plug that is mated with the jack.

SUMMARY OF THE INVENTION

The present invention provides a jack that is configured to mate with at least two different types of plugs. The jack comprises a wire board having first and second signal processing circuits thereon. When a first one of the different types of plugs is mated with the jack, the first signal processing circuit is activated. When a second one of the different types of plugs is mated with the jack, the second signal processing circuit is activated. The first signal processing circuit of the connector assembly includes crosstalk compensation circuitry for reducing or eliminating crosstalk. The second signal processing circuit of the connector assembly preferably does not include crosstalk compensation circuitry.

Certain standard-compliant plugs exhibit a known amount of crosstalk and the jacks with which the plugs are mated normally include crosstalk compensation circuitry for eliminating or reducing the crosstalk. Because these standard-compliant plugs are still in wide use today, a need exists for a jack that is configured to mate with these plugs and that have circuitry for reducing or eliminating the crosstalk in the plugs. However, cables and plugs are currently being designed that exhibit no crosstalk or only a small degree of crosstalk. Therefore, a need also exists for a jack that does not include crosstalk compensation circuitry. If a plug that exhibits a certain amount of crosstalk is mated with a jack that does not include crosstalk compensation circuitry, the connector assembly will not work properly. Similarly, if a plug that does not exhibit crosstalk is mated with a jack that includes crosstalk compensation circuitry, the connector assembly will not work properly.

The present invention provides a connector assembly comprising a jack that is configured with a first signal processing circuit that includes crosstak compensation circuitry and with a second processing circuit that does not include crosstalk compensation circuitry. This allows a single jack to be used with a low performance, standard-compliant plug that exhibits a certain level of crosstalk as well as with a high performance plug that exhibits no, or very little, crosstalk.

The first and second signal processing circuits constitute separate signal paths on the wire board. Thus, when the first plug is inserted into the jack, the signal is operated on in accordance with the configuration of the first signal processing circuitry, and when the second plug is inserted into the jack, the signal is operated on in accordance with the configuration of the second signal processing circuitry. Having separate signal paths on the wiring board of the jack for each different type of plug ensures that the signal will be properly processed.

When the first plug is mated with the communications jack, a first connector assembly is provided that compensates for crosstalk in the first plug. The first plug exhibits a predetermined level of crosstalk for which the first signal processing circuit is configured to compensate. When the second plug is mated with the communications jack, a second connector assembly is provided that does not compensate for crosstalk. The second signal processing circuit does not include signal processing circuitry because crosstalk is substantially absent from the second plug.

These and other features and advantages of the present invention will become apparent from the following description, drawings and claims.

DETAILED DESCRIPTION OF THE PREFERRED EMBODIMENT

Figure 1:
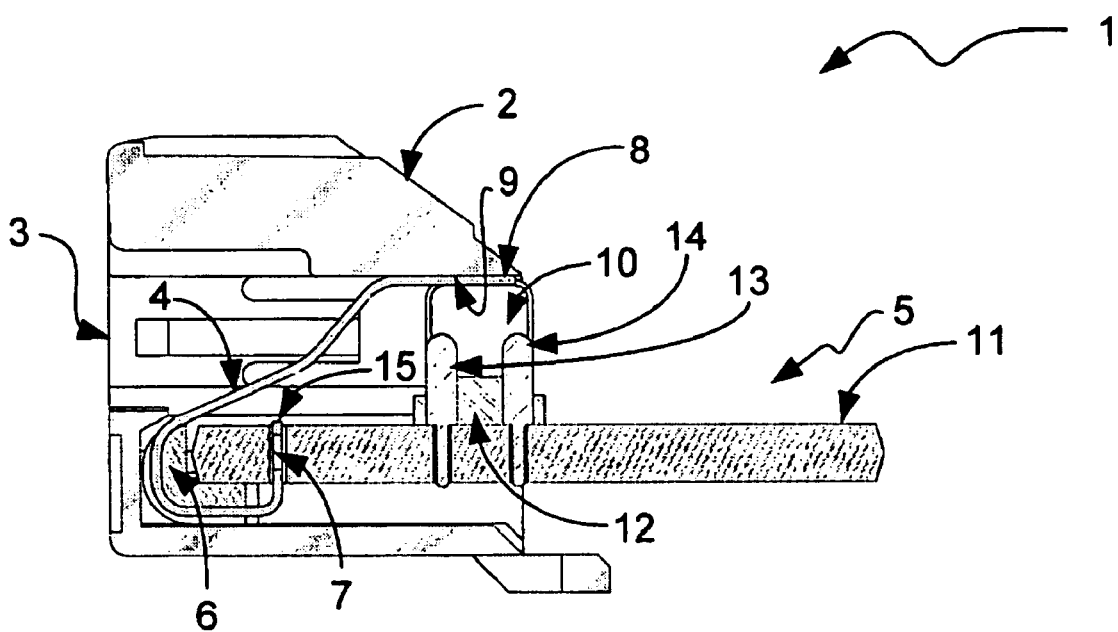
FIG. 1 is a side view of the jack of the present invention in accordance with the preferred embodiment.

In accordance with the present invention, a communications connector assembly is provided comprising a jack that is configured to mate with at least two plugs of different types. The jack comprises a wire board having at least two different sets of contacts. Each set of contacts is connected to a respective signal processing circuitry of the wire board. Thus, the wire board has at least two different signal paths, i.e., a separate signal path for each of the different plug types. The signal path that is activated at any given time depends on the type of plug that is mated with the jack. Consequently, the manner in which the signal from the plug is processed depends on the type of plug that is mated with the jack.

One goal of the present invention that is met by the embodiment described herein is eliminating moving parts in the connector assembly. By eliminating moving parts, the connector assembly is very robust and easy to assemble. Although the embodiment described herein is one arrangement that meets this objective, it should be noted that a variety of configurations could be derived from the principles and concepts of the present invention discussed herein. All of these configurations are within the scope of the present invention. In the interest of brevity, a single embodiment will be discussed. However, those skilled in the art will understand from the discussion provided herein that other configurations of the present invention could be designed using the principles and concepts demonstrated herein.

The present invention will now be described with reference to an example embodiment of the present invention in which the jack is configured to mate with two different types of plugs. The first plug is a TIA/EIA-568 Common Building Telecommunications Cabling Standard 568B plug (hereinafter "standard-compliant" plug). This particular plug is the most common type of plug found in commercial buildings. The TIA/EIA 568 standard specifies that the mated combination of the plug and jack must be at or below a certain crosstalk level. This type of plug is required to have a particular level of crosstalk, so the jack must be designed to compensate for this level of crosstalk. Other standard-compliant plugs would also be suitable for use with the jack of the present invention such as, for example, a plug that is compliant with the International Electrotechnical Commission (IEC) 60603-7 standard. The present invention is not limited to any particular types of plugs.

When the first plug is mated with the jack of the present invention, the contacts of the first plug deflect the contact wires of the jack onto a first set of contact posts on the wire board, which connect to a first signal processing circuit on the wire board. The first signal processing circuit includes crosstalk compenstion circuitry that compensates for crosstalk to ensure that the crosstalk of the mated combination of the jack and first plug is below the level specified by TIA/EIA standard 568.

The second plug is a high performance plug and is inserted farther into the jack of the present invention than the first plug, as described in detail below with reference to FIGS. 2A and 2B. For this plug, the jack does not require crosstalk compensation circuitry because the level of crosstalk in the plug is relatively low in comparison to the level of crosstalk exhibited by the first plug. When the second plug is mated with the jack of the present invention, the contact wires of the second plug deflect the contacts of the jack onto a second set of contact posts on the wire board, which connect to a second signal processing circuit on the wire board. The second signal processing circuit preferably does not include crosstalk compenstion circuitry because the crosstalk of the mated combination of the jack and second plug is already relatively low.

FIG. 1 is a side view of the jack 1 of the present invention in accordance with the preferred embodiment. The jack 1 comprises a jack frame 2 having an opening 3 formed in one end thereof for receiving a mating plug. The jack 1 comprises a jack wire assembly comprising jack contact wires 4 and a contact wire wrapping mandrel 6, which is coupled to a cover (not shown) that is coupled to slots formed on the inside of the jack frame 2. A printed wire board (PWB) 5 is secured to the jack 1. The contact wires 4 of the jack 1 are secured at first ends 15 thereof to the wire board 5. The contact wires 4 have ends 7 that are affixed to the wire board 5 and that wrap around the mandrel 6 such that have free ends 8 of the contact wires 4 face away from the opening 3 formed in the jack frame 2 and are pre-loaded through abutment with a surface 9 of the jack 1 just above the free ends 8 of the contact wires 4.

The wire board 5 has a contact post assembly 10 attached to the upper surface 11 of the wire board 5. The contact post assembly 10 comprises a dielectric base 12 and first and second rows 13 and 14 of contact posts. In accordance with this example, each row 13 and 14 has eight contact posts. Therefore, the connector assembly of the present invention in accordance with this embodiment is an 8-contact-wide assembly. Those skilled in the art, however, will understand from the description provided herein that the connector assembly of the present invention be a 6-contact-wide assembly, or any other number of contacts. The present invention is not limited to any particular number of contact posts or any particular type of plug. Also, the present invention is not limited to any particular number of rows of contacts, and thus is not limited with respect to the number of different types of plugs that the jack 1 can accommodate. For example, the wire board 5 could have three rows of contact posts and three different signal processing circuits for processing three different types of signals.

Figure 2A:
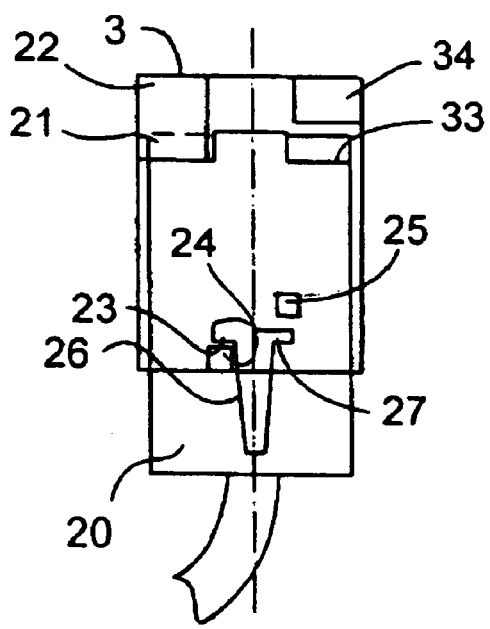
FIGS. 2A and 2B are top views illustrating a first plug and a second plug, respectively, mated with the jack shown in FIG. 1.
Figure 2B:
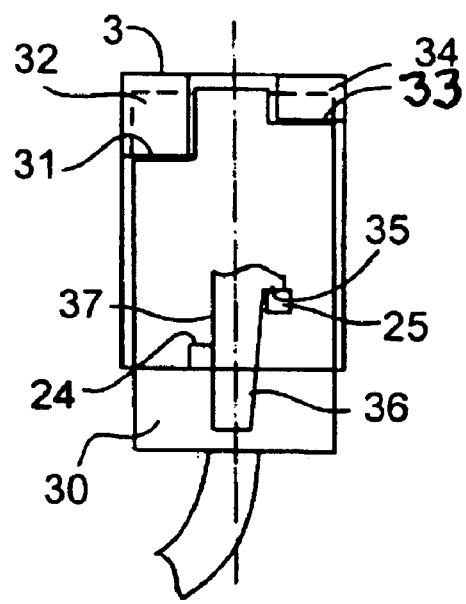

FIGS. 2A and 2B are top views of the jack 1 of the present invention mated with the first plug and the second plug, respectively. FIG. 2A depicts the first plug 20 inserted into the jack frame 3 of the invention. It can be seen that rearward movement is limited by the shoulder of notch 21 engaging elongated plug stop member 22, and reverse movement is prevented by latching shoulder 23 of the latching tab 26 of the first plug 20 engaging latching stub 24. As a consequence, plug 20 does not penetrate all the way into the jack frame 3, but, as will be seen clearly below with reference to FIG. 3, it does penetrate sufficiently into jack frame 3 to make the desired contact with the row 14 of contact posts to create a low performance connection with the first processing circuitry (not shown) on the wire board 5 (FIG. 1). The manner in which this occurs can be seen in FIG. 3 and will be discussed below in detail with reference to that figure.

When the first plug 20 is inserted into the jack frame 3, it is inserted a sufficient distance into the jack frame 3 to cause the latching shoulder 23 to engage the latching stub member 24. The jack frame 3 has a second latching stub 25 that does not engage the latching shoulder 27 of the latching tab 26 because of the engagement of the shoulder of notch 21 with the elongated plug stop member 22, which prevents further rearward movement (i.e., insertion) of the plug 20 within the jack frame 3.

FIG. 2B depicts the second plug 30 inserted into the jack frame 3 of the invention. The plug 30 is insertable into jack frame 3 until shoulder 31 engages plug stop 32 and shoulder 33 engages plug stop 34. In this position, latching shoulder 35 of the latching tab 36 latches to latch stub 25. In contrast to the latching tab 26 of the plug 20 shown in FIG. 2A, the latching tab 36 of plug 30 has a cutaway straight side 37 that prevents the latching tab 36 from engaging latch stub 24. If this were not the case, then when that shoulder passed over stub 24, an installer might be misled into thinking the connection (i.e., mating) was complete, even though the plug 30 had not been inserted sufficiently far into jack frame 3 for plug stops 34 and 32 to engage plug 30. At the position of the plug 30 shown in FIG. 2B, the plug 30 penetrates sufficiently into jack frame 3 (FIG. 4) to make the desired contact with the row 13 of contact posts to create a high performance connection with the second processing circuitry (not shown) on the wire board 5. The manner in which this occurs can be seen in FIG. 4 and will be discussed below in detail with reference to that figure.

Figure 3:
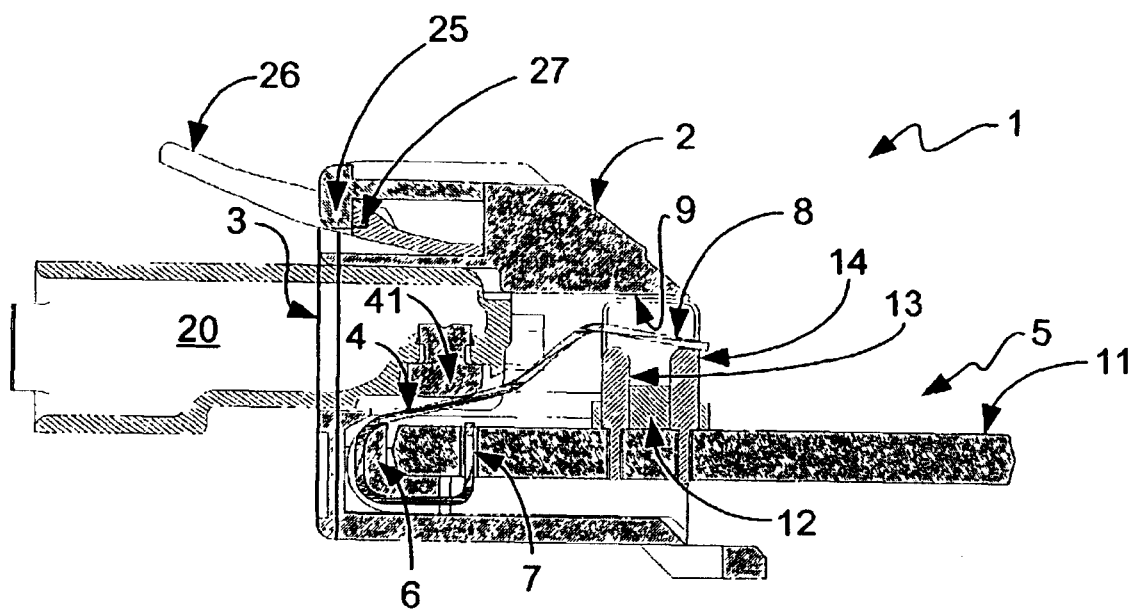
FIG. 3 is a side view of the jack shown in FIG. 1 mated with a plug of a first type.

FIG. 3 is a side view of the connector assembly shown in FIG. 2A, wherein the first plug 20 is fully inserted into the jack housing 3. At this position, the latching shoulder 27 on the side of the plug 20 has not engaged the latch stub 25, as shown, but the latching shoulder 23 (FIG. 2A) has engaged the latch stub 24 (FIG. 2A). The latching shoulder 23 and the latch stub 24 cannot be seen in the view shown in FIG. 3 because they are on the side of the plug 20 opposite the side shown in FIG. 3. At this position, the free ends 8 of the jack contact wires 4 are deflected by the plug blade 41 (the plug contact wires) downward away from the surface 9 of the jack housing 3 onto the row 14 of contact posts, thereby establishing a connection between the contact wires of the plug 20 and the first signal processing circuit of the wire board 5. As stated above, since the first plug 20 provides a particular level of crosstalk that must be compensated by the jack 1 of the present invention, the first signal processing circuit of the wire board 5 includes crosstalk compensation circuitry (not shown) that enables the signal from the plug 20 to be compensated for crosstalk.

Figure 4:
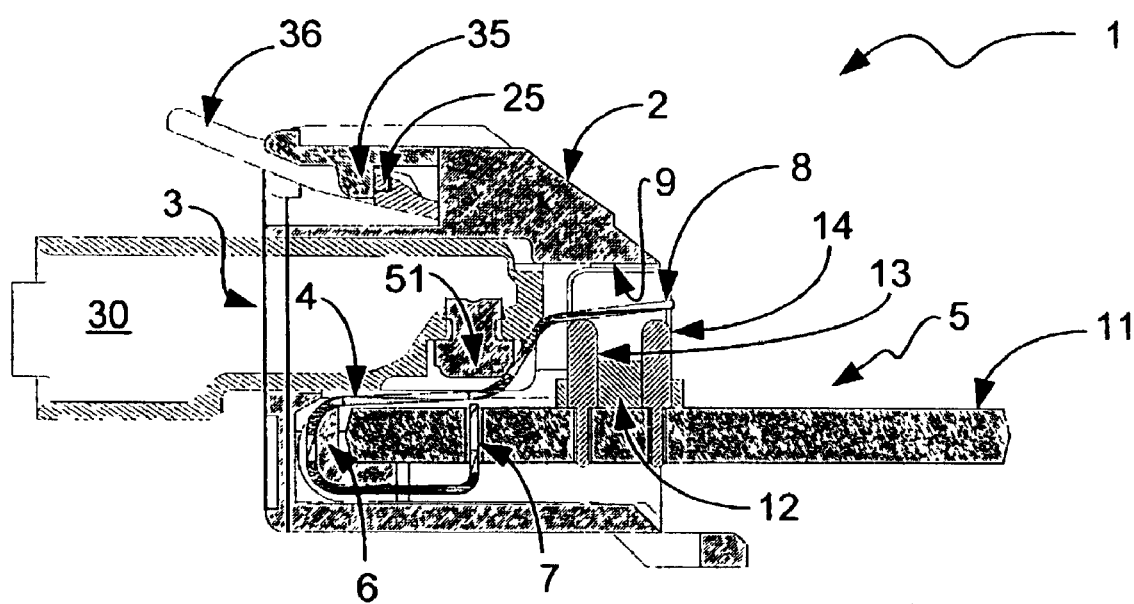
FIG. 4 is a side view of the jack shown in FIG. 1 mated with a plug of the second type.

FIG. 4 is a side view of the connector assembly shown in FIG. 2B, wherein the second plug 30 is fully inserted into the jack housing 3. In this position, the latching shoulder 27 on the side of the plug 20 has engaged the latch stub 25, as shown. The latch stub 24 cannot be seen in the view shown in FIG. 4 because it on the side of the plug 30 opposite the side shown in FIG. 4. At the position shown, the jack contact wires 8 are deflected by the plug blade 51 (the plug contact wires) downward away from the surface 9 of the jack housing 3 onto the row 13 of contact posts, thereby establishing an electrical connection between the contact wires of the plug blade 51 of the plug 30 and the second signal processing circuit (not shown) of the wire board 5, which, in contrast to the plug 20 shown in FIG. 3, preferably does not include crosstalk compensation circuitry.

The differences between the physical structures of the first plug 20 and the second plug 30 provide a keying mechanism that enables the jack 1 to detect the type of plug that has been inserted into the jack 1. These physical configurations of the plugs and jack are disclosed in the aforementioned U.S. Pat. No. 6,244,907, which, as stated above, is incorporated herein by reference. It should be noted that the present invention is not limited to using this particular keying mechanism. This keying mechanism is preferred, however, because the physical differences between the plugs also prevents accidental insertion of the high performance plug 30 into a low performance jack.

Figure 5A:
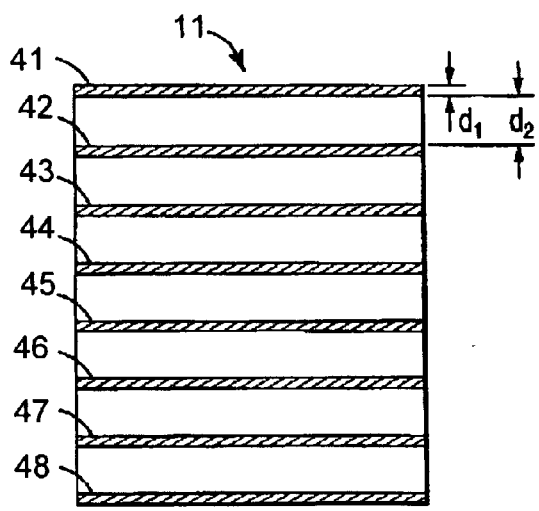
FIGS. 5A–5F illustrate various views of examples of crosstalk compensation circuitry that may be included on the wiring board 11 of the present invention.
Figure 5B:
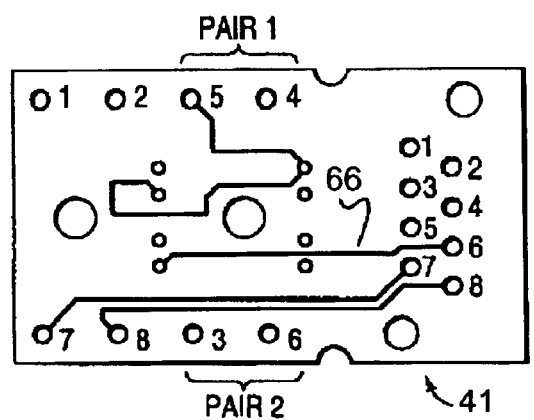
Figure 5C:
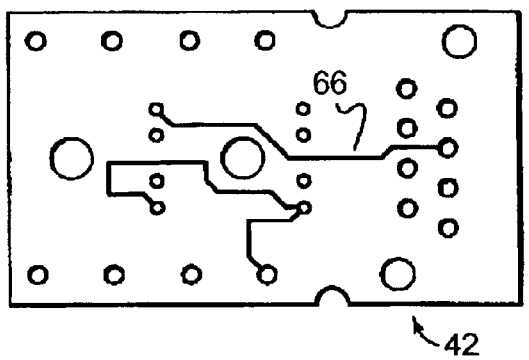

FIGS. 5A–5F illustrate various views of examples of crosstalk compensation circuitry that may be included on the wiring board 11 of the present invention. An end view of printed wiring board 11 is shown in FIG. 5A, which has eight layers of wiring paths for introducing compensating crosstalk. Each of the layers comprises one or more metallic paths of thickness $d_1$ positioned on a dielectric material of thickness $d_2$. The dimensions for $d_1$ and $d_2$ may be, for example, 0.04 millimeters (mm) and 0.30 mm, respectively. In FIG. 5A, eight double-sided printed wiring boards 601–605 are joined into a single unit 600 by epoxy layers in a manner known in the art. Each printed wiring board comprises a board material, such as FR-4, with conductive paths patterned on its top and bottom surfaces by standard techniques such as photolithography. While eight layers of signal paths are shown in this illustrative embodiment, it should be noted that any number can be employed.

Figure 5D:
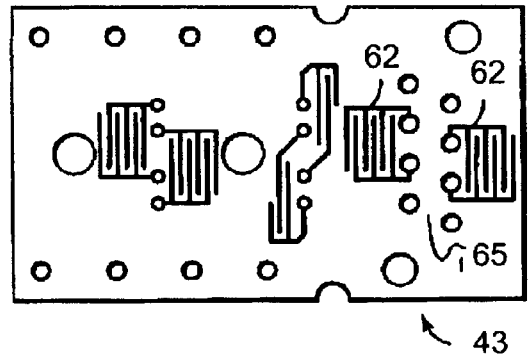
Figure 5E:
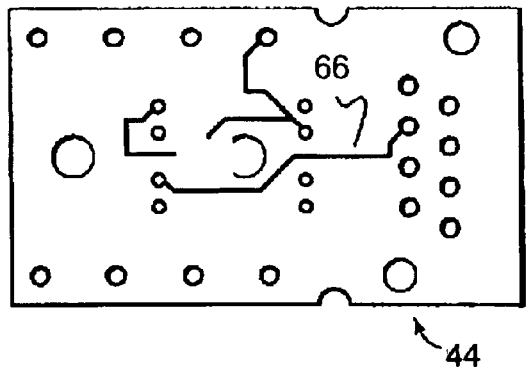
Figure 5F:
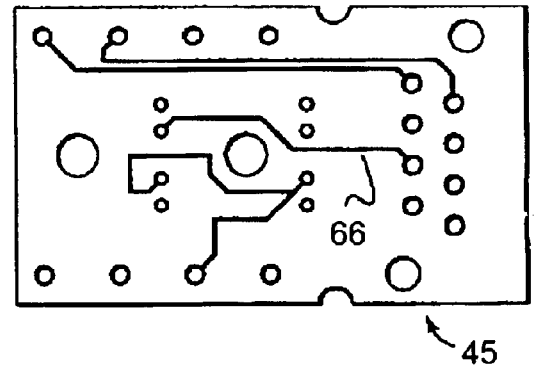

FIGS. 5B–5F show top views of the wiring layouts on each of the layers of the printed wiring board 11. In this example embodiment, the same wiring layout 43, shown in FIG. 5D, is used on four layers of the wiring board. In this particular embodiment of the invention, the wiring layout of FIGS. 5B–5F provides three stages of compensating crosstalk between wire-pair 1 (pins 4, 5) and wire-pair 2 (pins 3, 6), which are identified in FIG. 5B (the industry generally refers to pins 3, 6 as wire-pair 3). FIG. 5D shows discrete capacitors 62 connected between wire-pair 1 and wire-pair 2 at the closest possible point to where signals enter layer 43 in the jackwire terminal region 65 of board 11, and they comprise the first stage of compensating crosstalk. While these discrete capacitors 62 comprise closely spaced wiring patterns on a printed wiring board, stand-alone discrete component structures could also be used. Additionally, although not immediately apparent from the wiring paths shown in FIGS. 5B, 5C, 5E and 5F, inductive coupling exists between wire-pairs 1, 2 in region 66 in the form of closely spaced inductive loops that face each other. The self inductance of these loops improves the return-loss performance of the connector assembly, while the inductive coupling between these loops is part of the compensating crosstalk. As stated above, these crosstalk compensation circuits are only examples of crosstalk compensation circuits that can be used with the present invention.

It should be noted that the present invention has been described with reference to the preferred embodiments and that it is not limited to these embodiments. Modifications, additions and/or deletions can be made to the embodiments described herein without deviating from the scope of the present invention. Those skilled in the art will understand in view of the discussion provided herein that all such modifications, deletions and additions are within the scope of the present invention. For example, although the jack 1 is shown and described herein as having a particular design (e.g., contact posts arranged in two parallel rows on the wire board), those skilled in the art will understand in view of the disclosure that this design is only one of many possible designs for accomplishing the goals of the present invention. For example, although the jack is described as having a first signal processing circuit that comprises crosstalk compensation circuitry and a second signal path that does not, this is not necessarily the case. The jack could instead comprise a first signal processing circuit could reduce crosstalk to a particular level and a second signal processing circuit that reduces crosstalk to a lesser amount.

The present invention has been described with reference to any croosstalk compensation being performed in the jack rather than in the plug. It should be noted that the concepts of the present invention equally apply to the plug. More specifically, the plug could be configured to have a latching arm that can be moved to, for example, a first position and a second position. The second position would be rearward of the first position to allow the plug to be inserted farther into the jack. Therefore, when the latching arm is in the first position, crosstalk compensation circuitry in the plug would not be activated and the plug would mate with the jack in the manner shown in FIG. 3 such that the crosstalk compensation circuitry in the jack would be activated. When the latching arm of the plug is placed in the second position, the plug would be inserted further into the jack and mate with the jack in the manner shown in FIG. 4. In this case, crosstalk compensation circuitry in the plug would be activated, but no crosstalk compensation would be performed in the jack. With such a plug, only one set of latching stubs would be needed on the jack. Those skilled in the art will understand the many ways in which the concepts of the present invention may be implemented, and that all such implementations are within the scope of the present invention.

What is claimed is:

1. A communications connector assembly configured to provide at least first and second signal paths, the first signal path corresponding to a path through a first signal processing circuit of the connector assembly that processes a signal from a first one of at least two types of plugs, the second signal path corresponding to a oath through a second signal processing circuit of the connector assembly that processes a signal from a second one of said at least two types of plugs, the connector assembly comprising:

a jack configured to mate with said at least two different types of plugs, the jack comprising a wire board having the first and second signal processing circuits thereon, and wherein when the first one of said at least two different types of plugs is mated with the jack, the first signal processing circuit is activated, and wherein when a second one of said at least two different types of plugs is mated with the jack, the second signal processing circuit is activated;

wherein the wire board has first and second sets of wire board conductors thereon for providing electrical connections to the first and second signal processing circuits, respectively, the contact wires of the jack having fixed ends mechanically and electrically connected to the wire board and free ends suspended from the wire board, the jack being configured such that when the first plug is mated with the jack in a first mating position, the contacts of the first plug abut free ends of respective contact wires of the jack and cause the contact wires of the jack to be deflected onto respective wire board conductors of said first set, thereby activating the first signal processing circuit, and such that when the second plug is mated with the jack in a second mating position, the contacts of the second plug abut said free ends of respective contact wires of the jack and cause the contact wires of the jack to be deflected onto respective wire board conductors of the second set of wire board conductors, thereby activating the second signal processing circuit.

2. The connector assembly of claim 1, wherein the first signal processing circuit includes crosstalk compensation circuitry, the crosstalk compensation circuitry including capacitors that are electrically coupled between certain conductors of the crosstalk compensation circuitry, said certain conductors being electrically coupled to respective conductors of a cable attached to the connector assembly.

3. The connector assembly of claim 2, wherein the first plug is designed to exhibit a predetermined level of crosstalk, and wherein the crosstalk compensating circuitry of the first signal processing circuit compensates for the predetermined level of crosstalk.

4. The connector assembly of claim 1, wherein the first plug is mated with the jack when the first plug is inserted at least a first distance into the jack and wherein the second plug is mated with the jack when the second plug is inserted a second distance the second distance into the jack, D2 being greater than the first distance.

5. The connector assembly of claim 1, wherein the connector assembly operates as a relatively high performance connector assembly when the second plug is mated with the jack, and wherein the connector assembly operates as a relatively low performance connector assembly when the first plug is mated with the jack.

6. The connector assembly of claim 3, wherein the second plug exhibits substantially no crosstalk.

7. The connector assembly of claim 1, wherein the first set of wire board conductors correspond to a first row of contact posts affixed to the wire board and protruding from a surface of the wire board toward the free ends, and wherein the second set of wire board conductors correspond to a second row of contact posts affixed to the wire board and protruding from the surface of the wire board.

8. The connector assembly of claim 7, wherein the contact wires of the jack are shaped such that when the free ends of the contact wires are deflected by a first amount, the free ends come into contact with the first set of contact posts and such that when the free ends are deflected by a second amount, the free ends come into contact with the second set of contact posts, and wherein the free ends are only in contact with the first set of contact posts when the first plug is mated with the jack, and wherein the free ends are only in contact with the second set of contact posts when the second plug is mated with the jack.

9. A communications jack configured to mate with at least two different types of plugs, the jack comprising:
    a wire board having first and second signal processing circuits thereon, and wherein when a first one of the different types of plugs is mated with the jack, the first signal processing circuit is activated, the first signal processing circuit comprising crosstalk compensation circuitry, and wherein when a second one of the different types of plugs is mated with the jack, the second signal processing circuit is activated;
    wherein the wire board has first and second sets of wire board conductors thereon for providing electrical connections to the first and second signal processing circuits, respectively, the contact wires of the jack having fixed ends connected to the wire board and free ends suspended from the wire board, and wherein the jack is configured such that when the first plug is mated with the jack in a first mating position, the contacts of the first plug abut free ends of respective contact wires of the jack and cause the contact wires of the jack to be deflected onto respective wire board conductors of said first set, thereby activating the first signal processing circuit, and such that when the second plug is mated with the jack in a second mating position, the contacts of the second plug abut said free ends of respective contact wires of the jack and cause the contact wires of the jack to be deflected onto respective wire board conductors of said second set, thereby activating the second signal processing circuit.

10. The jack of claim 9, wherein the second signal processing circuit is configured to process a signal in a manner different from the manner in which the first signal processing circuit is configured to process signals, crosstalk compensation circuitry being absent from the second signal processing circuit.

11. The jack of claim 9, wherein the first plug is designed to exhibit a predetermined level of crosstalk, and wherein the crosstalk compensation circuitry of the first signal processing circuit includes components for compensating for the predetermined level of crosstalk.

12. The jack of claim 9, wherein the first plug is mated with the jack when the first plug is inserted at least a first distance into the jack and wherein the second plug is mated with the jack when the second plug is inserted a second distance into the jack, the second distance being greater than the first distance.

13. The jack of claim 9, wherein when the second plug is mated with the jack, the mated second plug and jack constitute a relatively high performance connector assembly, and wherein when the first plug is mated with the jack, the mated first plug and jack constitute a relatively low performance connector assembly.

14. The jack of claim 10, the second plug exhibits substantially no crosstalk.

15. The jack of claim 9, wherein the first set of wire board conductors correspond to a first row of contact posts affixed to the wire board and protruding from a surface of the wire board toward the free ends, and wherein the second set of wire board conductors correspond to a second row of contact posts affixed to the wire board and protruding from the surface of the wire board toward the free ends.

16. The jack of claim 15, wherein the contact wires of the jack are shaped such that when the free ends of the contact wires are deflected by a first amount, the free ends come into contact with the first set of contact posts and such that when the free ends are deflected by a second amount, the free ends come into contact with the second set of contact posts, and wherein the free ends are only in contact with the first set of contact posts when the first plug is mated with the jack, and wherein the free ends are only in contact with the second set of contact posts when the second plug is mated with the jack.

* * * * *